(12) United States Patent
Ranta et al.

(10) Patent No.: US 11,927,611 B2
(45) Date of Patent: Mar. 12, 2024

(54) METHOD FOR PREVENTING THEFT OF ENERGY IN ELECTRICITY METERS THAT ARE INSTALLED INVERTED

(71) Applicant: Honeywell International Inc., Morris Plains, NJ (US)

(72) Inventors: Mark Alan Ranta, Apex, NC (US); Dacon Thomas Chow, Cary, NC (US); Michael Anthony Murphy, Raleigh, NC (US); William Egolf, Apex, NC (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 205 days.

(21) Appl. No.: 17/246,878

(22) Filed: May 3, 2021

(65) Prior Publication Data

US 2022/0349927 A1    Nov. 3, 2022

(51) Int. Cl.
G01R 22/06    (2006.01)
(52) U.S. Cl.
CPC .................. G01R 22/066 (2013.01)
(58) Field of Classification Search
CPC .................. G01R 22/06–10; Y04S 20/30
See application file for complete search history.

(56) References Cited

U.S. PATENT DOCUMENTS

| | | | | |
|---|---|---|---|---|
| 4,104,588 A * | 8/1978 | Westberry | ............... | G01R 11/04 |
| | | | | 439/378 |
| 5,293,115 A * | 3/1994 | Swanson | ............ | G08B 13/1409 |
| | | | | 340/568.4 |
| 7,432,823 B2 | 10/2008 | Soni | | |
| 7,936,163 B2 * | 5/2011 | Lee, Jr. | ................. | G01R 22/066 |
| | | | | 324/110 |
| 2007/0033151 A1 * | 2/2007 | Lee | ..................... | G01R 19/2513 |
| | | | | 705/412 |
| 2009/0243866 A1 * | 10/2009 | Murphy | ............... | G01R 22/066 |
| | | | | 340/637 |
| 2011/0115642 A1 * | 5/2011 | Gilbert | ................ | G01R 22/066 |
| | | | | 340/635 |

(Continued)

FOREIGN PATENT DOCUMENTS

| | | |
|---|---|---|
| CA | 2101115 C | 4/2001 |
| CN | 106370904 A | 2/2017 |
| EP | 3232163 A2 | 10/2017 |

*Primary Examiner* — Huy Q Phan
*Assistant Examiner* — David B Frederiksen
(74) *Attorney, Agent, or Firm* — John Maldjian, Esq.; Stevens & Lee PC

(57) ABSTRACT

A system includes a sensor configured at a first position to sense an orientation of an electricity meter. The electricity meter can be configured at a second position. The electricity meter can be configured at a normal orientation to measure delivered energy sent to one or more locations and received energy received from the one or more locations. The electricity meter can be configured at an inverted orientation to identify and measure the delivered energy sent to the one or more locations and the received energy received from the one or more locations. The sensor is configured to identify when the electricity meter is in the normal orientation, and when the electricity meter is in the inverted orientation. A display is configured within the electricity meter.

17 Claims, 2 Drawing Sheets

(56) References Cited

U.S. PATENT DOCUMENTS

| | | | |
|---|---|---|---|
| 2015/0226769 A1* | 8/2015 | Boudreau, Jr. | G01R 33/07 |
| | | | 324/207.2 |
| 2015/0241488 A1* | 8/2015 | Sonderegger | G01R 22/066 |
| | | | 702/65 |
| 2018/0364286 A1* | 12/2018 | Sharp | G01R 22/066 |
| 2022/0011353 A1* | 1/2022 | Kraus | G01F 1/684 |

* cited by examiner

METHOD FOR PREVENTING THEFT OF ENERGY IN ELECTRICITY METERS THAT ARE INSTALLED INVERTED

TECHNICAL FIELD

The present disclosure generally relates to preventing the theft of electricity within a system.

BACKGROUND

Many electric utilities can lose revenue to due the theft of electricity. A common method of electricity theft is to remove the electricity meter from its original orientation and place the electricity meter in its inverted orientation, thereby preventing the electricity meter from properly metering any delivered energy to recipients.

Many electricity meters may be able to meter/measure the delivered energy that it sends to one or more locations when it is in a normal orientation. In such an orientation, the electricity flow will appear to be going forward from the utility grid through the electricity meter to the one or more locations receiving the electricity in the local premise.

Nevertheless, when the electricity meter is inverted or in the inverted orientation, the electricity flow can appear backward, wherein the electricity flow can appear as if it is originating from the local premise and going through the electricity meter to the utility grid. The electricity meter often cannot determine the delivered energy when it is inverted. As a result, recipients that receive the delivered energy when the electricity meter is inverted can receive the delivered energy without being billed for usage of the delivered energy. As a result, electricity theft can occur when the electricity meter is moved from its normal orientation.

As such, there is a need to provide an electricity meter that can prevent the electricity theft when the electricity meter is moved from a normal orientation to an inverted orientation. Moreover, an electricity meter has to be able to meter/measure delivered energy when the electricity meter is moved from its normal orientation.

SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is another aspect of the disclosed embodiments to provide for an electricity meter to detect delivered energy in the inverted orientation.

It is another aspect of the disclosed embodiments to provide an electricity meter to continuously measure the delivered energy in the inverted orientation.

The aforementioned aspects and other objectives can now be achieved as described herein.

In an embodiment, a system a sensor configured at a first position to determine an orientation of an electricity meter. The system also includes the electricity meter configured at a second position. The electricity meter is configured at a normal orientation to measure delivered energy sent to one or more locations and received energy received from the one or more locations. The electricity meter is also configured at an inverted orientation to identify and measure the delivered energy sent to the one or more locations and the received energy received from the one or more locations. The sensor is configured to identify when the electricity meter is in the normal orientation, and when the electricity meter is in the inverted orientation. The system also includes a display configured within the electricity meter.

In an embodiment of the system, the received energy is excess energy that the one or more locations send back to a utility grid.

In an embodiment of the system, wherein the electricity meter enables one or more readings of the delivered energy to be provided when the electricity meter is configured in the inverted orientation.

In an embodiment of the system, the system includes a sensor configured to identify an orientation of an electricity meter. The system also includes the electricity meter configured to be orientated in a normal orientation or an inverted orientation. The electricity meter is configured to measure delivered energy in the normal orientation, and identity the delivered energy to be measured in the inverted orientation apart from received energy, wherein the electricity meter is configured to prevent theft of electricity. The sensor identifies when the electricity meter is in the normal orientation and the inverted orientation. The system also includes a display. The display and sensor are configured within the electricity meter.

In an embodiment of the system, the electricity meter prevents the electricity theft by measuring the delivered energy when the electricity meter is in the inverted orientation.

In an embodiment of the system, wherein in the inverted orientation, the electricity meter is configured to determine the delivered energy being sent to one or more locations when a flow of electricity appears to come from the one or more locations and flow toward the electricity meter.

In another embodiment, a method includes configuring a sensor at a first position to determine an orientation of an electricity meter. The method also includes positioning the electricity meter at a second position, wherein the electricity meter is configured at a normal orientation to measure delivered energy sent to one or more locations and received energy received form the one or more locations. In addition, the electricity meter is configured at an inverted orientation to identify and measure the delivered energy sent to the one or more locations and the received energy received from the one or more locations. The sensor is configured to identify when the electricity meter is in the normal orientation, and when the electricity meter is in the inverted orientation. The method also includes configuring a display within the electricity meter.

In an embodiment of the system, wherein in the inverted orientation, the electricity meter is configured to identify electricity flow initially appearing to flow backward to be the delivered energy.

In an embodiment of the system, wherein electricity meter is configured to differentiate the delivered energy from the received energy in the inverted orientation.

BRIEF DESCRIPTION OF THE FIGURES

The accompanying figures, in which like reference numerals refer to identical or functionally similar elements throughout the separate views and which are incorporated in and form a part of the specification, further illustrate the present invention and, together with the detailed description of the invention, serve to explain the principles of the present invention.

Figure 1:
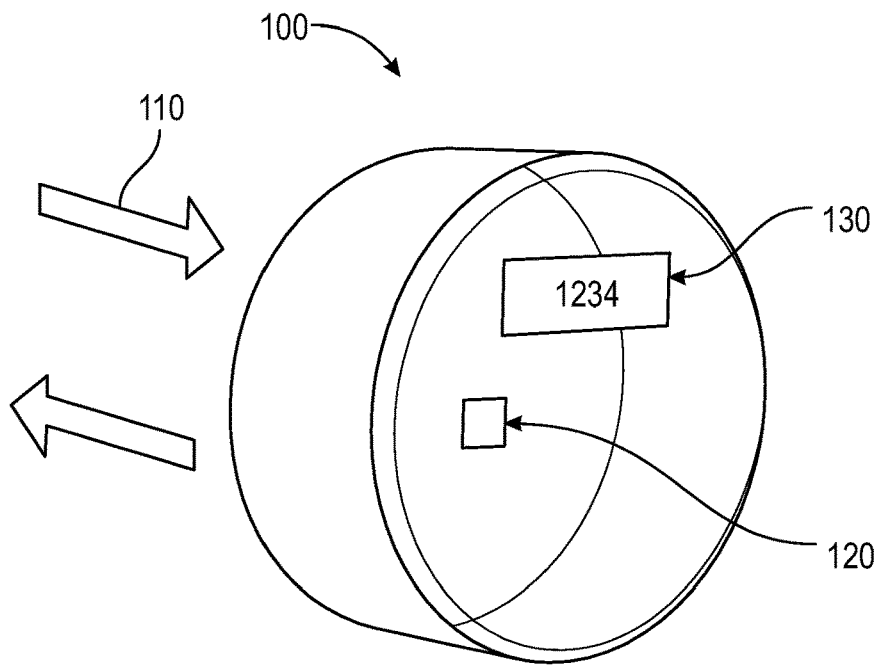
FIG. 1 illustrates an electricity meter configured in an original orientation in accordance with an embodiment of the invention.

Unless otherwise indicated illustrations in the figures are not necessarily drawn to scale.

DETAILED DESCRIPTION OF SOME EMBODIMENTS

Background and Context

The particular values and configurations discussed in these non-limiting examples can be varied and are cited merely to illustrate one or more embodiments and are not intended to limit the scope thereof.

Subject matter will now be described more fully herein after with reference to the accompanying drawings, which form a part hereof, and which show, by way of illustration, specific example embodiments. Subject matter may, however, be embodied in a variety of different form and, therefore, covered or claimed subject matter is intended to be construed as not being limited to any example embodiments set forth herein, example embodiments are provided merely to be illustrative. Likewise, a reasonably broad scope for claimed or covered subject matter is intended. Among other issues, subject matter may be embodied as methods, devices, components, or systems. The followed detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as a "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

One having ordinary skill in the relevant art will readily recognize the subject matter disclosed herein can be practiced without one or more of the specific details or with other methods. In other instances, well-known structures or operations are not shown in detail to avoid obscuring certain aspects This disclosure is not limited by the illustrated ordering of acts or events, as some acts may occur in different orders and/or concurrently with other acts or events. Furthermore, not all illustrated acts or events are required to implement a methodology in accordance with the embodiments disclosed herein.

Unless defined otherwise, all technical and scientific terms used herein have the same meanings as commonly understood by one of ordinary skill in the art to which the disclosed embodiments belong. Preferred methods, techniques, devices, and materials are described, although any methods, techniques, devices, or materials similar or equivalent to those described herein may be used in the practice or testing of the present invention.

Although claims have been included in this application to specific enumerated combinations of features, it should be understood the scope of the present disclosure also includes any novel feature or any novel combination of features disclosed herein.

References "an embodiment," "example embodiment," "various embodiments," "some embodiments," etc., may indicate that the embodiment(s) so described may include a particular feature, structure, or characteristic, but not every possible embodiment necessarily includes that particular feature, structure, or characteristic.

Headings provided are for convenience and are not to be taken as limiting the present disclosure in any way.

Each term utilized herein is to be given its broadest interpretation given the context in which that term is utilized.

Terminology

The following paragraphs provide context for terms found in the present disclosure (including the claims):

The transitional term "comprising", which is synonymous with "including," "containing," or "characterized by," is inclusive or open-ended and does not exclude additional, unrecited elements or method steps. See, e.g., Mars Inc. v. H. J. Heinz Co., 377 F.3d 1369, 1376, 71 USPQ2d 1837, 1843 (Fed. Cir. 2004) ("[L]ike the term 'comprising,' the terms 'containing' and 'mixture' are open-ended."). "Configured to" or "operable for" is used to connote structure by indicating that the mechanisms/units/components include structure that performs the task or tasks during operation. "Configured to" may include adapting a manufacturing process to fabricate components that are adapted to implement or perform one or more tasks.

"Based On." As used herein, this term is used to describe factors that affect a determination without otherwise precluding other or additional factors that may affect that determination. More particularly, such a determination may be solely "based on" those factors or based, at least in part, on those factors.

All terms of example language (e.g., including, without limitation, "such as", "like", "for example", "for instance", "similar to", etc.) are not exclusive of other examples and therefore mean "by way of example, and not limitation . . . ".

A description of an embodiment having components in communication with each other does not infer that all enumerated components are needed.

A commercial implementation in accordance with the scope and spirit of the present disclosure may be configured according to the needs of the particular application, whereby any function of the teachings related to any described embodiment of the present invention may be suitably changed by those skilled in the art.

The flowchart and block diagrams in the figures illustrate the architecture, functionality, and operation of possible implementations of systems and methods according to various embodiments. Functions noted in the block may occur out of the order noted in the figures. For example, two blocks shown in succession may, in fact, be executed substantially concurrently, or the blocks may sometimes be executed in the reverse order, depending upon the functionality involved.

Further, any sequence of steps that may be described does not necessarily indicate a condition that the steps be performed in that order. Some steps may be performed simultaneously.

The functionality and/or the features of a particular component may be alternatively embodied by one or more other devices that are not explicitly described as having such functionality/features. Also, various embodiments of the present invention need not include a device itself.

More specifically, as will be appreciated by one skilled in the art, aspects of the present invention may be embodied as a system and/or method. Furthermore, aspects of the present invention may take the form of a plurality of systems to enable gas meter to perform self-checking to determine its overall functioning without requiring a meter operator.

INTRODUCTION

Embodiments of the present invention include a system with an electricity meter in a system. The electricity meter can be configured with a sensor to monitor the orientation of the electricity meter, and to determine if the electricity meter is positioned at a normal/original orientation, or at an inverted orientation. When the electricity meter is at the normal orientation, the flow of the electricity from the electricity meter to one or more homes/locations is in the forward direction. The electricity is going from the utility grid through the electricity meter to the one or more homes/locations. The electricity meter can meter/measure the delivered energy to the one/or more homes and locations. The delivered energy is the energy that is being transferred to one or more external locations such as homes, businesses, and restaurants, etc.

In contrast to delivered energy, the received energy is the extra/surplus energy transferred back from one or more of the external locations to the utility grid. For instance, such locations that have solar windmills or the like can self-generate some energy, and often will not need all of the delivered energy from the electricity meter. As a result, such external locations can return some of the delivered energy that it received. The energy that is returned to the utility grid is referred to as received energy. A display can also be configured within the electricity meter.

Unlike the normal orientation, the electricity meter can also be in an inverted orientation or position. One or more electricity users can try to place the electricity meter into the inverted orientation. The sensor can determine that the electricity meter is in the inverted orientation. In the inverted orientation, the electricity flow appears in the backward or reverse direction from the normal orientation. The electricity flow will appear as if it is coming from the one or more homes/locations to the electricity meter. As such, in the inverted orientation, the delivered energy will initially appear as received energy. Nevertheless, the electricity meter, when in the inverted orientation, can recognize that the electricity that appears to be flowing backward and that appears to be received energy, is actually delivered energy. As such, the electricity meter can recognize that the flowing electricity is actually flowing to the one or more homes/locations, and is actually delivered energy. As such, the electricity meter can meter this delivered energy in the inverted orientation. The electricity meter can meter the delivered energy as accurately in the inverted orientation as in the normal orientation. Consequently, any electricity theft is prevented.

In summary, in the normal orientation, the electricity flows forward to the one or more homes/locations, and the electricity meter is able to meter the delivered energy. In the inverted orientation, the energy will appear to be flowing backward from the one or more homes/locations to the electricity meter. However, the electricity meter will recognize the energy as delivered energy, and not received energy, and accordingly meter the delivered energy while in the inverted orientation. Accordingly, any potential electricity theft is prevented.

System Structure

FIG. 1 illustrates an electricity meter 100 in the normal orientation, incoming and outgoing current 110 go to and from the electricity meter 100. The electricity meter 100 is configured to measure delivered energy to one or more locations. Such locations will include homes, business, and other places that require electricity. Some of the locations will be solely reliant on the electricity meter 100, In addition, other outside locations can generate their own energy. Locations that have solar panels and solar windmills, as examples, can generate their own energy. As such, if more energy is generated locally than is needed by these locations, then these locations do not need any delivered energy from the electricity meter 100. As a result, these locations will return any excess energy back to a utility grid. The energy returned to the utility grid can be the received energy. To places where the delivered energy exceeds the self-generated energy, the utility grid will consistently receive some received energy accordingly.

In FIG. 1, a sensor 120 is configured within the electricity meter 100. The sensor 120 can determine the orientation of the electricity meter 100. The sensor 120 can determine when the electricity meter 100 is in the normal orientation. In the normal orientation, the electricity flow from the electricity meter 100 will appear to go forward. The energy/electricity will flow from the electricity meter 100 to one or more homes locations. The electricity meter 100 can meter the delivered energy sent to the one or more homes/locations. The electricity meter 100 can also measure the received energy that the one or more homes/locations may send back to the utility grid. A display 130 can also be configured within the electricity meter 100. Users may attempt to move the electricity meter 100 from its normal orientation to an inverted orientation to attempt to receive the delivered energy without the electricity meter 100 being able to meter the delivered energy.

In FIG. 1, the sensor 120 will simply sense the orientation of the electricity meter 100. The electricity meter 100 continuously meters the delivered energy in the normal orientation. The electricity meter 100 also is able to distinguish what is delivered energy and what is received energy. As such, the electricity meter 100 will consistently meter the delivered energy and the received energy. The sensor 120 will consistently identify when the electricity meter 100 is in the normal orientation, and when it has been moved to an inverted orientation.

Figure 2:
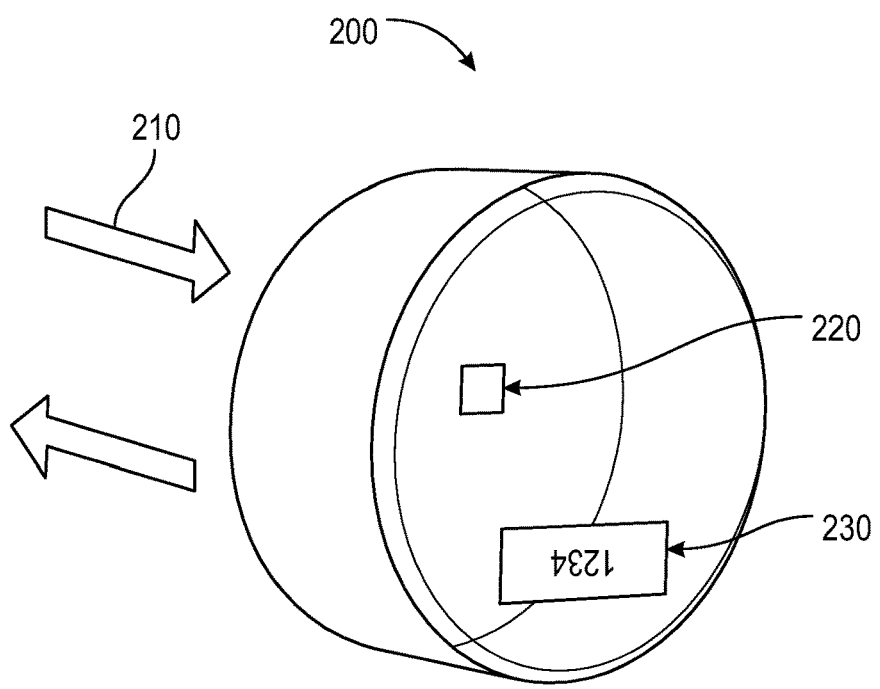
FIG. 2 illustrates an electricity meter configured in an inverted orientation in accordance with an embodiment of the invention.

Referring to FIG. 2, an electricity meter 200 is shown to be in an inverted orientation. As mentioned above, one or more users can physically move the electricity meter 200 from its normal orientation in FIG. 1, to the inverted orientation. The current 210 can go to and from the electricity meter 200. The sensor 220 can sense when the electricity meter 200 is in the inverted orientation. The current 210 can show the delivered energy and the received energy. The delivered energy is the energy provided to one or more outside locations in need of energy. The received energy is the energy returned to the utility grid from the one or more outside locations. One or more locations can generate their own generate their own energy using solar panels or the like. In such instances, these locations may not need all of the delivered energy. As such, these self-generating locations can return the excess energy hack to the utility grid. The excess energy returned hack to the utility grid is the received energy.

In FIG. 2, the electricity flow or current 210 can appear backward in comparison to when the electricity meter 200 is in the normal orientation. The current 210 can appear as it is coming from one or more locations and onto the electricity meter 200. Moreover, it can appear as if the electricity meter 200 is receiving only received energy, and that delivered energy is not being transferred to one or more locations. However, the electricity meter 200, in the inverted orientation, can still determine what energy is delivered energy and what energy is received energy. As such, the electricity meter 200 can still identify the delivered energy and the received energy when the electricity meter 200 is in the inverted orientation. The electricity meter 200 can identify the delivered energy as accurately in the inverted orientation as when it is in the normal orientation.

Referring to FIG. 2, as the electricity meter 200 can determine the delivered energy when in the inverted orientation, the electricity meter 200 can thereby meter or measure the delivered energy. As a result, when the electricity meter 200 is able to meter the delivered energy when inverted, any potential electricity theft can be prevented. One or more users may have placed the electricity meter 200 in the inverted orientation to attempt to receive the delivered energy without the electricity meter 200 being able to measure the delivered energy. However, since the electricity meter 200 can still identify the delivered energy and received energy accurately when it is inverted, the electricity meter 200 can still measure the delivered energy, and prevent any potential electricity theft. Moreover, the electricity theft is prevented because the metering of the delivered energy ensures that the users of the delivered energy will be billed accordingly. As in FIG. 1, a display 230 can be configured within the electricity meter 200 as well.

In FIG. 2, in summary, the electricity meter 200, in the inverted orientation, can still identify the delivered energy even when the electricity flow appears to be flowing backward from the one or more locations to the electricity meter 200. Even in such instances, the electricity meter 200 can still correctly and accurately identify the delivered energy that is being delivered to the one or more locations even though the electricity flow appears to be coming from the one or more locations. As a result, the electricity meter 200 can still determine the actual delivered energy and the actual received energy when inverted. Moreover, the electricity meter 200 can continue to properly meter the delivered energy and ensure that the users of the delivered energy can be billed for its usage.

Figure 3:
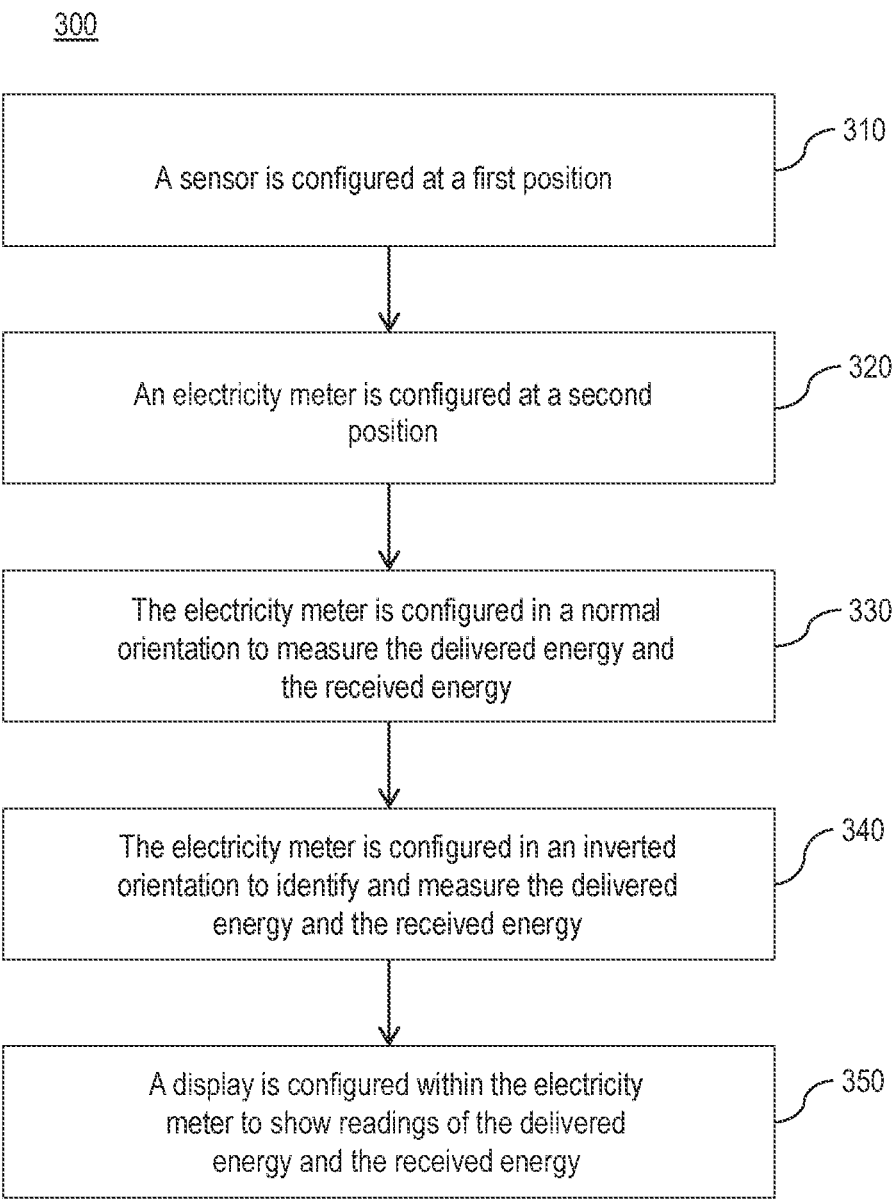
FIG. 3 illustrates a method describing a sensor managing the electricity meter in accordance with an embodiment of the invention.

In FIG. 3, a process 300 is illustrated in which the electricity meter is able to still accurately meter the delivered energy to one or more locations when it is in the inverted orientation. The electricity meter is able to identify the delivered energy even though the electricity flow appears backward in the inverted orientation, wherein the electricity flow appears as if the energy is flowing from the one or more locations to the electricity meter.

In FIG. 3, at step 310, a sensor, configured within the electricity meter, is configured at a first position. The sensor is configured to sense the orientation of the electricity meter. As such, the sensor is configured to sense when the electricity meter is in the normal orientation, and when the electricity meter is in the inverted orientation.

Referring to FIG. 3, at step 320, an electricity meter is configured at a second position. The electricity meter is configured to measure the delivered energy that is sent to the one or more locations and received energy that the one or more locations send back to the utility grid. The one or more locations can self-generate some of their own energy, and some of the delivered energy can be determined to be in excess and not needed by the one or more locations. In such instances, the one or more locations return the excess energy to the utility grid. The energy returned to the utility grid from the one or more locations is the received energy.

In FIG. 3, at step 330, the electricity meter is configured in a normal orientation to measure/meter the delivered energy that is sent to one or more locations. The electricity meter also can measure the received energy returned from the one or more locations. When the electricity meter is in the normal orientation, the electricity flow will appear forward, where the electricity will flow toward the one or more locations.

Referring to FIG. 3, at step 340, the electricity meter is configured at the inverted orientation to measure the delivered energy sent to the one or more locations, and the received energy that the one or more locations have sent back to the utility grid. In the inverted orientation, the electricity flow will appear backward, wherein the electricity flow will appear as if energy is flowing from the one or more locations to the electricity meter. Nevertheless, in the inverted orientation, the electricity meter can accurately identify the delivered energy being delivered to the one or more locations even though the energy or electricity flow appears backward due to the inverted orientation of the electricity meter. In the inverted orientation, the electricity meter can also identify the received energy as well. Accordingly, in the inverted orientation, although the electricity appears backward as if it is flowing from the one or more locations, the electricity meter is still able to identify the delivered energy and the received energy correctly. As a result, electricity theft is prevented because the electricity meter can still measure the delivered energy correctly in the inverted orientation.

In FIG. 3, at step 350, a display is configured within the electricity meter.

Those skilled in the art will appreciate that the example embodiments are non-exhaustive and that embodiments other than that described here may be included without departing from the scope and spirit of the presently disclosed embodiments.

Advantages

The electricity meter in the inverted orientation can still identify the delivered energy and the received energy. In the inverted orientation, the electricity/energy flow will appear as if the electricity is flowing from the one or more locations to the electricity meter. Due to the inverted orientation of the electricity meter, the electricity flow can appear as it is flowing from the one or more locations to the electricity meter. However the electricity meter can identify the delivered energy, and differentiate the delivered energy from the received energy.

As mentioned above, the received energy is the excess energy that locations which self-generate energy return to the utility grid. Accordingly, even though the electricity flow appears backward and flowing from one or more locations to the electricity meter, the electricity can still accurately determine the delivered energy from the electricity meter to the one or more locations.

In summary, the electricity meter can measure the delivered energy in the normal orientation and the inverted orientation. When in the inverted orientation, when the electricity flow appears as if it is occurring from one or more locations to the electricity meter, the electricity meter can still identify the delivered energy to the one or more locations. As the electricity meter can identify the delivered energy in the inverted orientation, the electricity meter can still measure the delivered energy accordingly. As a result, any potential electricity theft is prevented since the electricity meter can still measure the delivered energy in the inverted orientation.

CONCLUSION

All references, including granted patents and patent application publications, referred herein are incorporated herein by reference in their entirety.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Various aspects of the invention have been described above by way of illustration, and the specific embodiments disclosed are not intended to limit the invention to the particular forms disclosed. The particular implementation of the system provided thereof may vary depending upon the particular context or application. The invention is thus to cover all modifications, equivalents, and alternatives falling within the spirit and scope of the following claims. It is to be further understood that not all of the disclosed embodiments in the foregoing specification will necessarily satisfy or achieve each of the objects, advantages, or improvements described in the foregoing specification.

The corresponding structures, materials, acts, and equivalents of all means or step plus function elements in the claims below are intended to include any structure, material, or act for performing the function in combination with other claimed elements as specifically claimed.

The invention claimed is:

1. A system comprising:
   a sensor configured at a first position to determine an orientation of an electricity meter;
   the electricity meter configured at a second position, wherein the electricity meter is configured at a normal orientation to measure delivered energy sent to one or more locations and received energy received from the one or more locations, and configured at an inverted orientation to identify and measure the delivered energy sent to the one or more locations and the received energy received from the one or more locations, wherein the sensor is configured to identify when the electricity meter is in the normal orientation, and when the electricity meter is in the inverted orientation;
   wherein, in the inverted orientation, the electricity flows backward from the one or more locations to the electricity meter,
   wherein in the inverted orientation, the electricity meter is configured to differentiate the delivered energy from the received energy when a flow of electricity appears to flow backward toward the electricity meter, and
   a display configured within the electricity meter.

2. The system of claim 1, wherein the received energy is excess energy that the one or more locations return to a utility grid.

3. The system of claim 1, wherein the electricity meter enables one or more readings of the delivered energy to be provided when the electricity meter is configured in the inverted orientation.

4. The system of claim 1, wherein the electricity meter identifies a flow of electricity to be the delivered energy when the electricity meter is in the inverted orientation.

5. The system of claim 1, wherein the electricity meter is configured to prevent theft of electricity when the electricity meter is configured in the inverted orientation.

6. The system of claim 1, wherein a flow of electricity is configured to appear opposite in the inverted orientation to the flow of electricity in the normal orientation.

7. A system comprising:
   a sensor configured to identify an orientation of an electricity meter;
   the electricity meter configured to be orientated in a normal orientation or an inverted orientation, wherein the electricity meter is configured to measure delivered energy in the normal orientation, and identify the delivered energy to be measured in the inverted orientation apart from received energy, wherein the electricity meter is configured to prevent theft of electricity, and wherein the sensor identifies when the electricity meter is in the normal orientation and the inverted orientation;
   wherein, in the inverted orientation, the electricity flows backward from the one or more locations to the electricity meter,
   wherein in the inverted orientation, the electricity meter is configured to differentiate the delivered energy from the received energy when a flow of electricity appears to flow backward toward the electricity meter, and
   a display configured within the electricity meter, wherein the display and sensor are configured within the electricity meter.

8. The system of claim 7, wherein the electricity meter prevents the electricity theft by measuring the delivered energy when the electricity meter is in the inverted orientation.

9. The system of claim 7, wherein in the inverted orientation, the electricity meter is configured to determine the delivered energy being sent to one or more locations when a flow of electricity appears to come from the one or more locations and flow toward the electricity meter.

10. The system of claim 7, wherein the received energy is additional energy which one or more locations return to a utility grid.

11. The system of claim 7, wherein the electricity meter is configured to continuously measure the delivered energy in the inverted orientation to provide one or more different readings of the delivered energy.

12. The system of claim 11, wherein the electricity meter can measure the delivered energy with a same level of accuracy in the inverted orientation and the normal orientation.

13. A method comprising:
configuring a sensor at a first position to determine an orientation of an electricity meter;
positioning the electricity meter at a second position, wherein the electricity meter is configured at a normal orientation to measure delivered energy sent to one or more locations and received energy received from the one or more locations, and configured at an inverted orientation to identify and measure the delivered energy sent to the one or more locations and the received energy received from the one or more locations, wherein the sensor is configured to identify when the electricity meter is in the normal orientation, and when the electricity meter is in the inverted orientation;
wherein, in the inverted orientation, the electricity flows backward from the one or more locations to the electricity meter,
wherein in the inverted orientation, the electricity meter is configured to differentiate the delivered energy from the received energy when a flow of electricity appears to flow backward toward the electricity meter, and
configuring a display within the electricity meter.

14. The method of claim 13, wherein in the inverted orientation, the electricity meter is configured to identify electricity flow initially appearing to flow backward to be the delivered energy.

15. The method of claim 13, wherein the electricity meter is configured to continuously measure the delivered energy in the inverted orientation.

16. The method of claim 13, wherein readings of the delivered energy are consistently provided when the electricity meter is in the inverted orientation.

17. The method of claim 13, wherein electricity appears to flow from the one or more locations to the electricity meter when the electricity meter is in the inverted orientation.

* * * * *